US008438865B2

(12) United States Patent
Frey et al.

(10) Patent No.: US 8,438,865 B2
(45) Date of Patent: May 14, 2013

(54) COOLING SYSTEM AND METHOD FOR COOLING AN AIRCRAFT DEVICE

(75) Inventors: Andreas Frey, Immenstaad (DE); Ahmet Kayihan Kiryaman, Hamburg (DE); Carsten Colberg, Hamburg (DE); Peter Schwebke, Elmenhorst (DE); Markus Kerber, Reinfeld (DE); Michael Dreyhaupt, Hamburg (DE)

(73) Assignee: Airbus Operations GmbH (DE)

( * ) Notice: Subject to any disclaimer, the term of this patent is extended or adjusted under 35 U.S.C. 154(b) by 926 days.

(21) Appl. No.: 12/514,742

(22) PCT Filed: Nov. 20, 2007

(86) PCT No.: PCT/EP2007/010050
§ 371 (c)(1),
(2), (4) Date: Aug. 31, 2009

(87) PCT Pub. No.: WO2008/061713
PCT Pub. Date: May 29, 2008

(65) Prior Publication Data
US 2010/0051237 A1    Mar. 4, 2010

Related U.S. Application Data

(60) Provisional application No. 60/866,453, filed on Nov. 20, 2006, provisional application No. 60/914,362, filed on Apr. 27, 2007.

(30) Foreign Application Priority Data

Nov. 20, 2006   (DE) .......................... 10 2006 054 560
Apr. 27, 2007   (DE) .......................... 10 2007 020 037

(51) Int. Cl.
| | |
|---|---|
| F25B 17/00 | (2006.01) |
| F25B 15/00 | (2006.01) |
| F25B 27/00 | (2006.01) |
| B60H 1/32 | (2006.01) |
| F25D 17/02 | (2006.01) |
| F25D 3/00 | (2006.01) |
| F25C 5/08 | (2006.01) |

(52) U.S. Cl.
USPC .................. 62/106; 62/239; 62/101; 62/244; 62/238.3; 62/477; 62/476; 62/201; 62/389; 62/349

(58) Field of Classification Search .................... 62/239, 62/106, 101, 244, 238.3, 476–477, 201, 389, 62/349
See application file for complete search history.

(56) References Cited

U.S. PATENT DOCUMENTS

| | | |
|---|---|---|
| 3,387,648 A | 6/1968 | Ward et al. |
| 4,739,823 A | 4/1988 | Howard |

(Continued)

FOREIGN PATENT DOCUMENTS

| | | |
|---|---|---|
| DE | 4105034 A1 | 8/1992 |
| DE | 69005701 T2 | 4/1994 |

(Continued)

OTHER PUBLICATIONS

Decision on Granting a Patent for Invention for parallel Russian patent application No. 2009122348/11, dated Feb. 15, 2012 (2 pages).

(Continued)

Primary Examiner — Frantz Jules
Assistant Examiner — Erik Mendoza-Wilkenfel
(74) Attorney, Agent, or Firm — Barnes & Thornburg LLP

(57) ABSTRACT

A cooling system (10) for cooling an aircraft device (12) comprises an evaporator (14, 16, 18) for receiving a fluid (F) which is to be evaporated, a first adsorber (24) which contains a medium (28) for the adsorption of the fluid (F) which is evaporated in the evaporator (14, 16, 18), as well as a second adsorber (26) which contains a medium for the adsorption of the fluid (F) which is evaporated in the evaporator (14, 16, 18). A control system (22) is adapted to establish or to interrupt a fluid connection between the evaporator (14, 16, 18) and the first and/or the second adsorber(s) (24, 26).

16 Claims, 4 Drawing Sheets

U.S. PATENT DOCUMENTS

Figure 1:
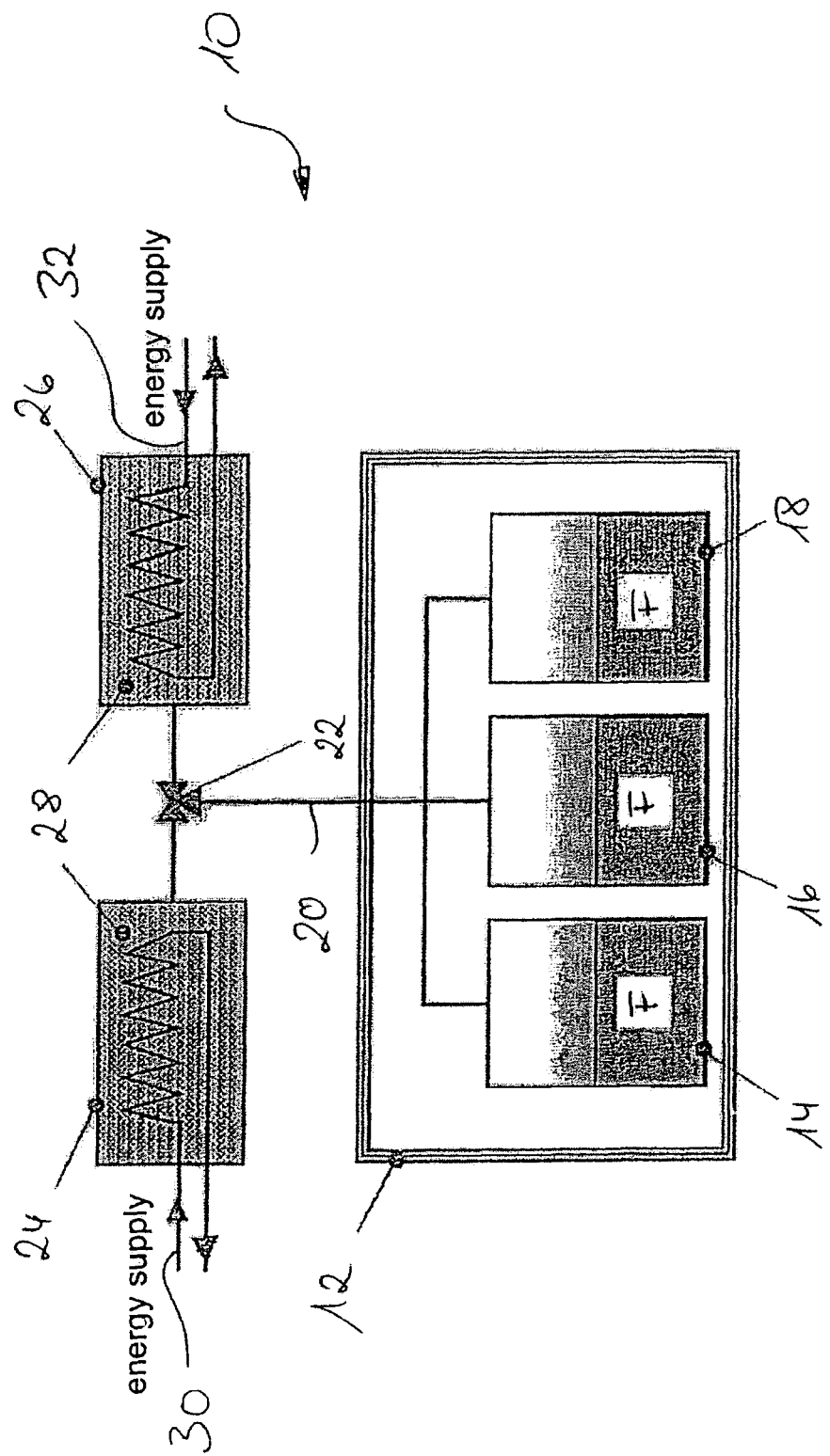

| | | | |
|---|---|---|---|
| 5,415,012 A | 5/1995 | Maier-Laxhuber et al. | |
| 5,477,706 A | 12/1995 | Kirol et al. | |
| 5,491,979 A * | 2/1996 | Kull et al. | 62/185 |
| 5,653,111 A | 8/1997 | Attey et al. | |
| 2005/0210910 A1 | 9/2005 | Rigney | |

FOREIGN PATENT DOCUMENTS

| | | |
|---|---|---|
| DE | 4340316 A1 | 1/1995 |
| DE | 4327444 A1 | 2/1995 |
| DE | 4340316 A1 | 6/1995 |
| DE | 4340317 | 3/1996 |
| DE | 19811719 A1 | 9/1999 |
| DE | 10009521 A1 | 8/2001 |
| DE | 69528783 T2 | 7/2003 |
| DE | 20308158 U1 | 9/2003 |
| DE | 102004019790 A1 | 11/2005 |
| DE | 102004020642 A1 | 11/2005 |
| DE | 102005015718 A1 | 10/2006 |
| DE | 102006041788 A1 | 3/2008 |
| DE | 102006054560 A1 | 5/2008 |
| EP | 0655592 A1 | 10/1994 |
| EP | 0655592 A | 5/1995 |
| EP | 0655593 A | 5/1995 |
| EP | 1158389 A2 | 11/2001 |
| EP | 1448040 A1 | 2/2004 |
| EP | 1448040 A | 8/2004 |
| JP | 6159854 A | 6/1994 |
| JP | 7225074 A | 8/1995 |
| JP | 8254369 A | 10/1996 |
| RU | 2106584 C1 | 3/1998 |
| RU | 2127212 C1 | 3/1999 |

OTHER PUBLICATIONS

English Translation of the first Office Action titled "Notice of Reasons for Rejection," issued for the parallel Japanese Patent Application No. 2009-5636675, dated Jul. 10, 2012 (3 pages).

Decision on Granting a Patent for Invention for Russian patent application No. 2009122348/11, dated Feb. 15, 2012 (2 pages).

Decision on Granting a Patent for Invention for Russian patent application No. 2009122347/11, dated Feb. 10, 2012 (4 pages).

* cited by examiner

COOLING SYSTEM AND METHOD FOR COOLING AN AIRCRAFT DEVICE

CROSS-REFERENCE TO RELATED APPLICATIONS

This application is a U.S. national counterpart application of international application serial No. PCT/EP2007/010050 filed Nov. 20, 2007, which claims priority to U.S. Provisional Patent Application No. 60/866,453 filed Nov. 20, 2006, to German Patent Application No. 102006054560.5 filed Nov. 20, 2006, to U.S. Provisional Patent Application No. 60/914,362 filed Apr. 27, 2007, and to German Patent Application No. 102007020037.6 filed Apr. 27, 2007.

The present invention relates to a cooling system as well as a method for cooling an aircraft device.

A large number of various technical devices which generate heat and which must be cooled in order to guarantee a safe mode of operation are provided in the interior of aircraft. Also located in the interior of aircraft are various closed spaces, so-called compartments, which must be moderated in temperature to temperatures lying below the cabin temperature. Various cooling systems are therefore provided in aircraft.

For example, it is known from DE 41 05 034 A1 to provide, for each galley, an independent cooling device which works with cold air as the cooling medium and has its own compression-type refrigerating machine (air chiller).

As an alternative to this, DE 43 40 317 C2 describes a centralised compression-type refrigerating machine whose refrigerating capacity is distributed in an aircraft via a refrigerant bus. Cooling systems with a compression-type refrigerating machine have the disadvantage of generating machine noises which can be heard in the aircraft passenger cabin and may therefore be experienced as disturbing. Moreover, on account of the rotating components which are present, systems of this kind have low overall reliability.

In addition, according to the disclosure of DE 38 12 739 C1, a cooling chamber provided inside a galley of an aircraft is disposed near an outer skin of the aircraft, and a cold air chamber is provided between the cooling chamber and the outer skin of the aircraft. The cold air chamber exchanges heat with the outside air via the outer skin. A disadvantage of skin heat exchangers of this kind lies in the fact that the outside air cannot be used as a heat sink at high ambient temperatures. It is therefore impossible to provide sufficient cooling capacity when the aircraft is on the ground on hot days.

The object of the invention is to provide a cooling system as well as a method for cooling an aircraft device by means of which heat-generating and other devices in an aircraft can be cooled reliably and continuously.

This object is achieved by a cooling system for cooling an aircraft device which has the features indicated in Claim 1 as well as a method for cooling an aircraft device which has the features indicated in Claim 9.

A cooling system according to the invention for cooling an aircraft device comprises an evaporator for receiving a fluid which is to be evaporated. In dependence on the cooling energy requirement one evaporator or a plurality of evaporators can be employed in the cooling system according to the invention. For example, the evaporator can be in the form of a plate which is filled with the fluid which is to be evaporated. The evaporator or evaporators can completely or partly enclose a volume which is to be cooled or be disposed at a specific location or at specific locations in the volume which is to be cooled. As an alternative to this, the evaporator itself can be a store for a fluid which is to be cooled, as will subsequently be explained in greater detail. Water or alcohol, for example, can be employed as fluid to be evaporated which is received in the evaporator.

The cooling system according to the invention comprises a first adsorber which contains a medium for the adsorption of the fluid which is evaporated in the evaporator. Also provided is a second adsorber which likewise contains a medium for the adsorption of the fluid which is evaporated in the evaporator. A fine-porous substance such as, e.g. activated carbon, zeolite, silica gel or similar, is preferably employed as the adsorption medium. When the fluid which is evaporated in the evaporator is adsorbed at the adsorption medium the gaseous fluid is adsorbed in a few molecular layers at the adsorption medium. Heat of condensation is released in this physico-energetic process, which corresponds to condensation, so that regeneration energy must be supplied to the first and second adsorber for regeneration, i.e. to desorb the adsorbed fluid molecules from the adsorption medium. An adsorber is therefore not available during its regeneration for the adsorption of fluid which is evaporated by the evaporator.

The cooling system according to the invention therefore comprises a control system which is adapted to establish or to interrupt a fluid connection between the evaporator and the first and/or the second adsorber(s). The fluid connection between the evaporator and one of the two adsorbers can be interrupted by means of the control system, so that the adsorber, which now no longer is in fluid connection with the evaporator, can be regenerated by supplying regeneration energy. The control system can connect the evaporator to the other adsorber during the regeneration phase of the adsorber, so that continuous operation of the cooling system according to the invention is guaranteed.

For example, the control system can interrupt the fluid connection between the evaporator and one of the two adsorbers, if the partial pressure of the fluid which is evaporated in the evaporator in the adsorber corresponds to the fluid partial pressure in the evaporator. However, the control system can also establish or interrupt the fluid connection between the evaporator and the first and/or the second adsorber(s) at any desired instants. The control system can also be adapted to control the volume flow of the fluid which is evaporated in the evaporator in the direction of the first and/or the second adsorber(s). It is as a result possible to set a desired temperature and/or a desired state in an aircraft device which is cooled by the cooling system.

In the cooling system according to the invention the fluid which is to be evaporated in the evaporator absorbs heat from an aircraft device which is to be cooled and in the process changes its state of aggregation. The cooling system can therefore function without moving parts, so that disturbing machine noises can be prevented and the overall reliability of the system can be increased. Furthermore, the system can be installed on board the aircraft in a relatively simple manner and deliver cooling energy independently of the electrical power supply system of the aircraft during the evaporation process. Finally, because it does not employ fluorocarbons (HFCs) as refrigerant, the system is particularly environmentally friendly and permits specific heat management as well as specific energy management.

In one preferred embodiment of the cooling system according to the invention the first and/or the second adsorber(s) are/is integrated into a refrigeration cycle or an energy supply system which provides the energy which is required for the regeneration of the first and/or the second adsorber(s). For example, the energy which is necessary for the regeneration of the first and/or the second adsorber(s) can be taken from the cabin waste air, which as a result is cooled to a lower temperature. Higher overall efficiency at aircraft level is obtained on the whole by integrating the cooling system according to the invention with other systems on board the aircraft. Furthermore, weight advantages can be achieved. In the cooling system according to the invention the regeneration of an adsorber can be isolated from the cooling function of the system. Therefore the regeneration energy which is supplied to an adsorber has no influence on the device which is cooled by the cooling system.

The first and/or the second adsorber(s) are/is preferably connected to a fluid removal device which is adapted to remove fluid released during the regeneration of the first and/or the second adsorber(s) from the first and/or the second adsorber(s). In the cooling system according to the invention fluid which is desorbed from the adsorption medium in the first and/or the second adsorber(s) is therefore not returned directly into the evaporator. The system according to the invention can therefore be employed in a particularly flexible manner. The fluid removal device may, for example, comprise a first removal line which is connected to the first adsorber as well as a second removal line which is connected to the second adsorber. Appropriate control valves can be provided in the first and/or the second removal line(s) in order to control the removal of desorbed fluid from the first and/or the second adsorber(s). The first and second removal lines can open into a common removal collecting line.

The fluid removal device can, for example, be connected to a cooler which serves to cool fluid which is desorbed from the adsorption medium in the first and/or the second adsorber(s) to a desired temperature. The cooler is preferably in fluid connection with a fluid inlet of the evaporator, so that a closed cooling system is obtained. In a cooling system which comprises a plurality of evaporators the fluid inlet of each evaporator is preferably connected to a separate supply line in which a control valve for controlling the supply of fluid from the cooler into the respective evaporator is disposed. The individual supply lines can open into a supply collecting line which is connected to the cooler.

The fluid removal device of the cooling system according to the invention is preferably connected to a waste water system of the aircraft. In this embodiment of the system water is used in the evaporator as the fluid which is to be evaporated. Water which is desorbed from the adsorption medium in the first and/or the second adsorber(s) and is present in vapour form is fed from the first and/or the second adsorber(s) via the fluid removal device into the waste water system of the aircraft and supplied to a water storage tank, for example.

A fluid inlet of the evaporator can be connected to a water supply system of the aircraft, so that a semi-open cooling system which is integrated into the water supply system of the aircraft is obtained.

In one preferred embodiment of the cooling system according to the invention a water storage tank which is employed in a water dispenser system is used as the evaporator. In the case of water dispenser systems which are currently employed on board an aircraft to supply the passengers with drinking water it is usual to cool a drinking water storage tank with active cooling methods, for example by means of a compression-type refrigerating machine. An integrated water dispenser/cooling system is therefore provided by the present invention. Drinking water which is received in the water storage tank is evaporated and supplied to the first and/or the second adsorber(s) if the temperature of the drinking water which is received in the water storage tank exceeds a desired temperature. Cooling energy is as a result released, so that non-evaporating water remaining in the water storage tank is cooled.

During normal operation of a drinking water dispenser system employed on board an aircraft the drinking water storage tank is maintained at a specific overpressure in order to provide a delivery pressure required for tapping the drinking water from the drinking water storage tank. However, in order to initiate the evaporation process described above, an underpressure has to be built up in the water storage tank. The water storage tank is therefore preferably connected to a pressure regulating system which can build up an underpressure or an overpressure in the water storage tank according to requirements.

In a method according to the invention for cooling an aircraft device a fluid is evaporated in an evaporator and a fluid connection between the evaporator and a first adsorber is established, so that the fluid which is evaporated in the evaporator is adsorbed at a medium which is contained in the first adsorber. At a predetermined instant, for example when a partial pressure of the fluid which is evaporated in the evaporator in the first adsorber corresponds to the fluid partial pressure in the evaporator, the fluid connection between the evaporator and the first adsorber is interrupted and a fluid connection between the evaporator and a second adsorber is established, so that the fluid which is evaporated in the evaporator is adsorbed at a medium which is contained in the second adsorber. Regeneration energy is supplied to the first adsorber while the evaporator is connected to the second adsorber. In the method according to the invention the fluid connection between the evaporator and the second adsorber can accordingly be interrupted and a fluid connection between the evaporator and the first adsorber can be established instead while regeneration energy is supplied to the second adsorber. The present invention therefore provides a continuous method for the adsorption cooling of an aircraft device.

A continuous cooling process is preferably implemented by the method according to the invention for cooling an aircraft device through the alternating use of the first and second adsorbers.

The energy which is required to regenerate the first and/or the second adsorber(s) is preferably provided by a refrigeration cycle or an energy source present in the aircraft, for example tapped air from the power units, into which the first and/or the second adsorber(s) are/is integrated.

Fluid which is released during the regeneration of the first and/or the second adsorber(s) can be removed from the first and/or the second adsorber(s) via a fluid removal device which is connected to the first and/or the second adsorber(s).

For example, the fluid which is released during the regeneration of the first and/or the second adsorber(s) can be supplied via the fluid removal device to a cooler which in turn is in fluid connection with a fluid inlet of the evaporator.

The fluid which is released during the regeneration of the first and/or the second adsorber(s) can be supplied via the fluid removal device to a waste water system of the aircraft.

In one preferred embodiment of the method according to the invention for cooling an aircraft device water is supplied to a fluid inlet of the evaporator from a water supply system of the aircraft.

A water storage tank which is employed in a water dispenser system on board an aircraft is preferably used as the evaporator.

The pressure in the water storage tank can be regulated by means of a pressure regulating system which is connected to the water storage tank.

The cooling of the aircraft device is preferably not impaired in the method according to the invention for cooling an aircraft device.

Figure 2:
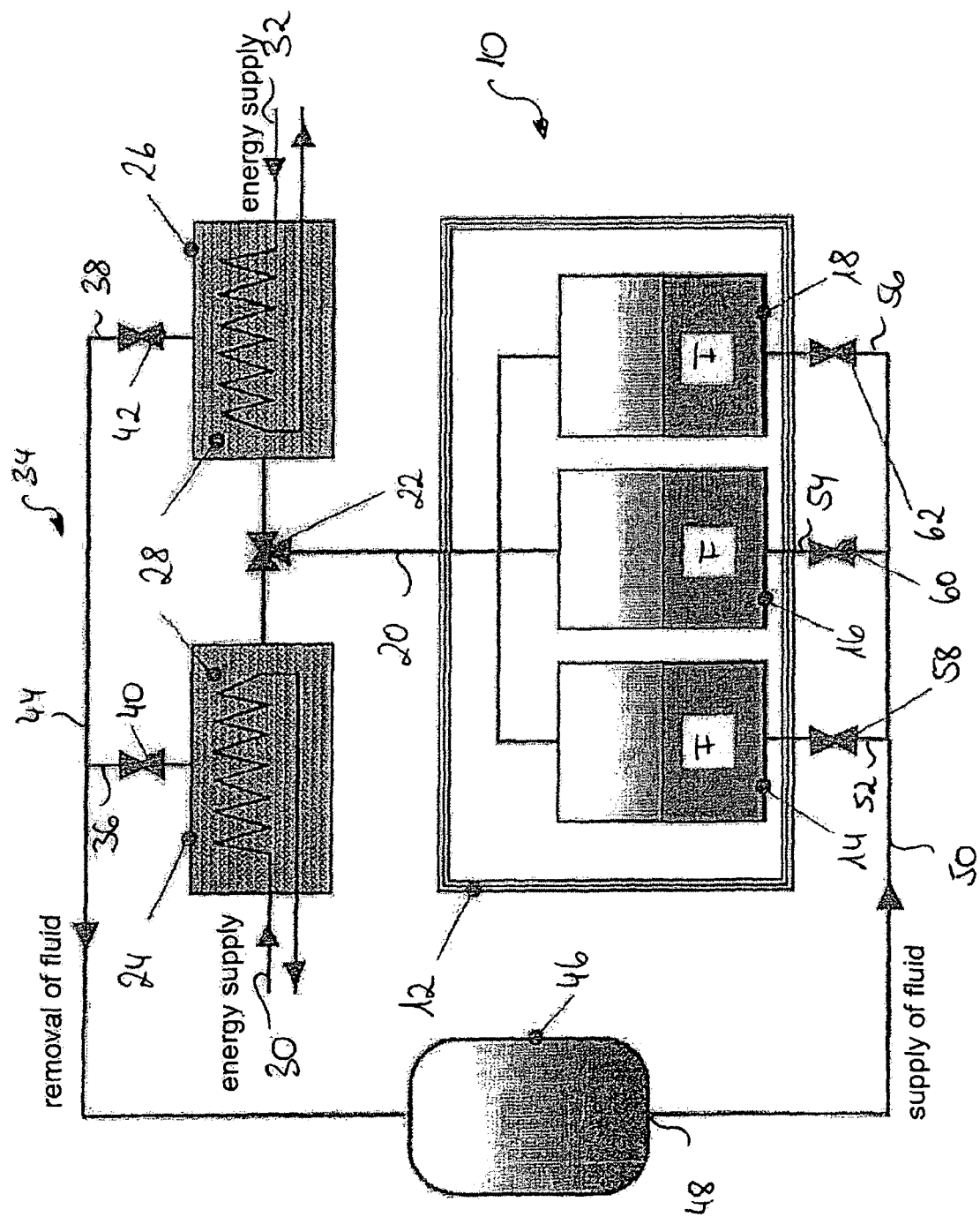
Figure 3:
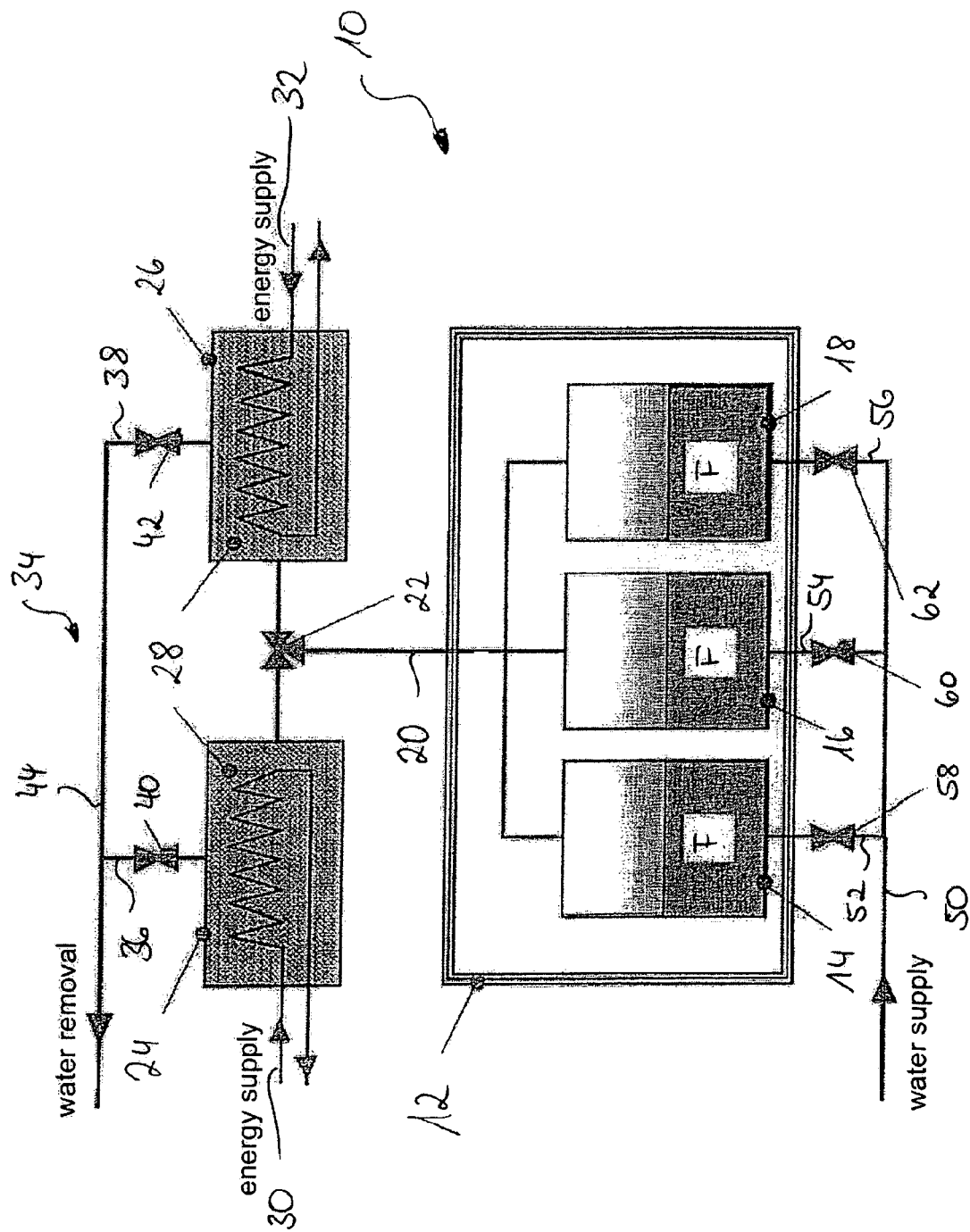
Figure 4:
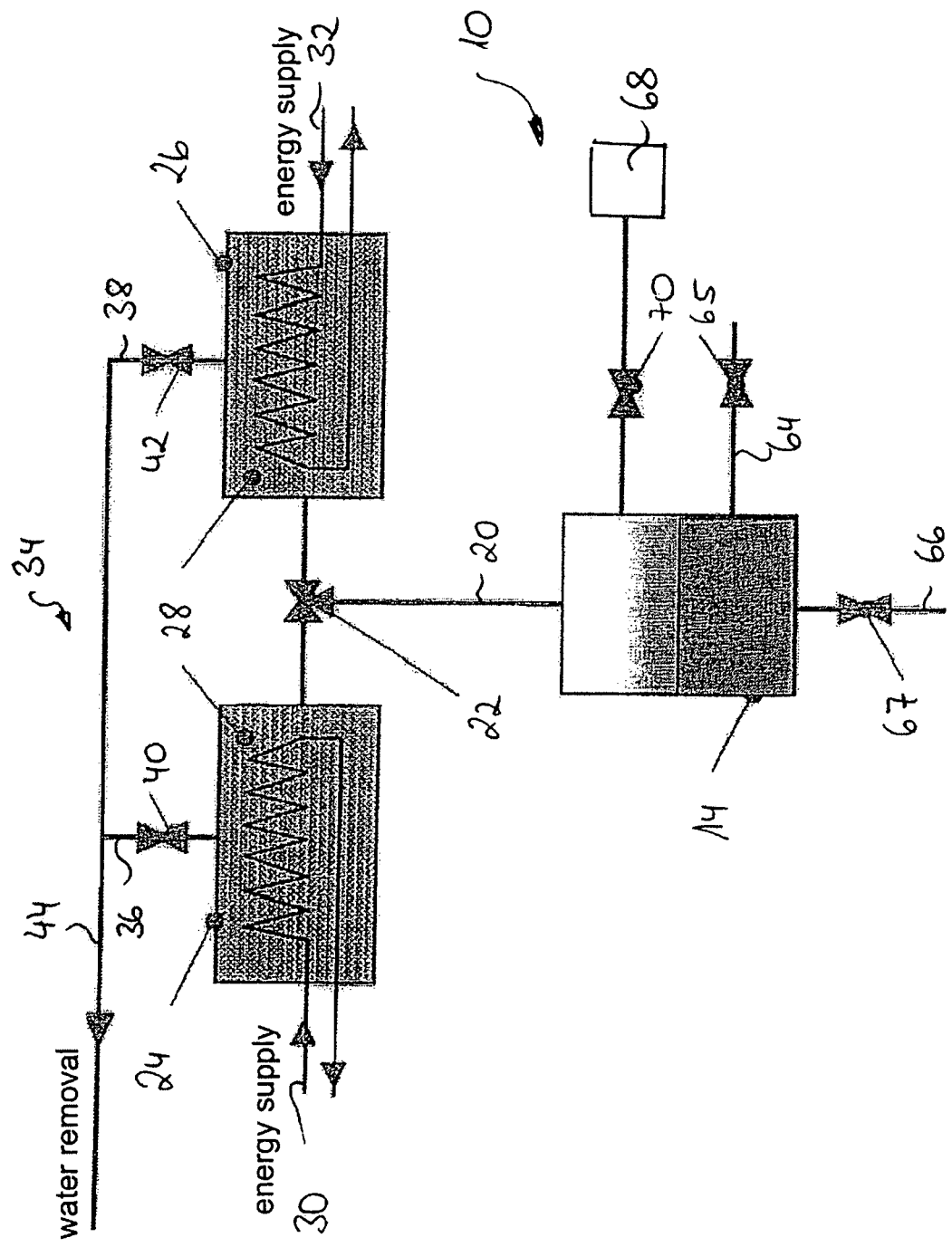

Preferred embodiments of the present invention are now illustrated in detail on the basis of the accompanying, schematic drawings, of which:

FIG. 1 shows the basis structure of a cooling system according to the invention for cooling an aircraft device, FIG. 2 shows a cooling system according to the invention for cooling an aircraft device which is formed as a closed system, FIG. 3 shows a cooling system according to the invention for cooling an aircraft device which is formed as a semi-open system, and FIG. 4 shows a cooling system according to the invention in which a water storage tank of a water dispenser system provided on board an aircraft is employed as the evaporator.

FIG. 1 shows a cooling system 10 for cooling an aircraft device 12 which comprises three evaporators 14, 16, 18 which are distributed in the aircraft device 12 which is to be cooled. A fluid F, for example alcohol or water, is received in each evaporator, which fluid is intended to be evaporated in the evaporator 14, 16, 18 and to deliver the cooling energy which is released upon the change in its state of aggregation to the aircraft device 12 which is to be cooled.

The evaporators 14, 16, 18 are connected via a connecting line 20 to a control system 22 which is in the form of a three-way valve. The evaporators 14, 16, 18 can be either connected to a first or a second adsorber 24, 26 or separated from the first and/or the second adsorber 24, 26 by means of the control system 22. The control system 22 is formed as a three-way valve with a variable flow cross section, so that a variable setting of the supply of fluid from the evaporators 14, 16, 18 to the first and/or the second adsorber(s) 24, 26 is possible.

The first and the second adsorbers 24, 26 both contain a fine-porous adsorption medium 28, for example activated carbon, zeolite or silica gel. The adsorption medium 28 has a large surface, so that the fluid F which is evaporated in the evaporator 14, 16, 18 can be adsorbed in only a few molecular layers at the adsorption medium 28.

Energy is released when the fluid which is evaporated in the evaporators 14, 16, 18 is adsorbed at the adsorption medium 28. Energy must therefore be applied for the reverse process, i.e. for the desorption of the fluid molecules from the adsorption medium 28. The first and second adsorbers 24, 26 both are therefore connected to an energy supply device 30, 32, via which regeneration energy can be supplied to the first and second adsorbers 24, 26.

The mode of operation of the cooling system 10 is illustrated in the following. As already mentioned, the fluid F which is received in the evaporators 14, 16, 18 is evaporated during operation of the cooling system 10. The cooling energy which is released in the process is supplied to the aircraft device 12 which is to be cooled. The fluid F leaving the evaporators 14, 16, 18 in the gaseous state is supplied via the control system 22 to the first adsorber 24, so that the fluid molecules are adsorbed on the surface of the adsorption medium 28 in the first adsorber 24.

If the partial pressure of the fluid F which is evaporated in the evaporators 14, 16, 18 corresponds to the fluid partial pressure in the first adsorber 24, the adsorption medium 28 in the first adsorber 24 is "saturated" and requires regeneration. Thermal energy is supplied to the first adsorber 24 via the energy supply device 30 for this purpose. The fluid molecules adsorbed at the surface of the adsorption medium 28 are as a result desorbed and the adsorption medium 28 is therefore re-activated to receive new fluid molecules.

The fluid connection between the evaporators 14, 16, 18 and the first adsorber 24 is interrupted by means of the control system 22 during the regeneration of the adsorption medium 28 in the first adsorber 24. The fluid connection between the evaporators 14, 16, 18 and the second adsorber 26 is at the same time opened. The fluid F which is evaporated in the evaporators 14, 16, 18 is therefore supplied to the second adsorber 26 and adsorbed at the adsorption medium 28 provided in the second adsorber 26 during the regeneration of the adsorption medium 28 in the first adsorber 24.

The fluid connection between the evaporators 14, 16, 18 and the second adsorber 26 can similarly be interrupted during the regeneration of the adsorption medium 28 in the second adsorber 26 and the fluid connection between the evaporators 14, 16, 18 and the first adsorber 24 re-established instead. The cooling system 10 therefore permits continuous cooling operation. Furthermore, the aircraft device 12 which is to be cooled is isolated from the energy supply devices 30, 32 for supplying regeneration energy to the first and second adsorbers 24, 26 and is therefore not influenced by the regeneration energy which is supplied to the first and second adsorbers 24, 26.

During operation of the cooling system 10 there is an underpressure both in the evaporators 14, 16, 18 and in the first and/or second adsorber 24, 26 which are in fluid connection with the evaporators 14, 16, 18. The cooling capacity of the cooling system 10 is controlled by the fluid volume flow which is supplied by the evaporators 14, 16, 18 to the first and/or the second adsorber(s) 24, 26 via the control system 22. The temperature of the aircraft device 12 which is to be cooled can therefore be set by appropriately controlling the fluid volume flow from the evaporators 14, 16, 18 in the direction of the first and/or the second adsorber(s) 24, 26 by means of the control system 22 in the form of a three-way valve with a variable flow cross section. The cooling system 10 therefore permits active heat management.

FIG. 2 shows a cooling system 10 which is in the form of a closed system and can be employed on board an aircraft for cooling a galley. In the cooling system 10 the first and the second adsorbers 24, 26 are integrated into a refrigeration cycle, which is not illustrated in detail in FIG. 2, so that the regeneration energy which is supplied to the first and second adsorbers 24, 26 during the regeneration phases can be taken from the cabin waste air which is removed from an aircraft cabin. The system 10 can as a result be operated in a particularly energy-efficient manner, so that the overall efficiency at aircraft level can be improved.

The first and second adsorbers 24, 26 of the cooling system 10 both are connected to a fluid removal device 34, via which fluid F which is desorbed from the adsorption medium 28 in the first and second adsorbers 24, 26 during the regeneration phases can be removed in the gaseous state from the first and second adsorbers 24, 26. The fluid removal device 34 comprises a first removal line 36 which is connected to the first adsorber 24 as well as a second removal line 38 which is connected to the second adsorber 26. A respective valve 40, 42 for controlling the fluid removal from the first and second adsorbers 24, 26 is disposed in the first and the second removal line 36, 38.

The first and the second removal line 36, 38 open into a removal collecting line 44 which is connected to a cooler 46. The fluid F which is removed from the first and second adsorbers 24, 26 during the regeneration phases of the first and second adsorbers 24, 26 is cooled to a desired temperature in the cooler 46.

A fluid outlet 48 of the cooler 46 is connected via a supply collecting line 50 to supply lines 52, 54, 56, via which fluid F which is cooled in the cooler 46 can be routed into the evaporators 14, 16, 18. Respective valves 58, 60, 62 are disposed in the supply lines 52, 54, 56 to control the supply of fluid from the cooler 46 into the individual evaporators 14, 16, 18.

The cooling system 10 which is shown in FIG. 3 and which can likewise be used to cool a galley differs from the system which is represented in FIG. 2 in that it is formed as a semi-open system. The cooling system 10 according to FIG. 3 is in particular distinguished by the fact that it is integrated into a water supply or waste water system, which is not illustrated in detail, on board the aircraft. For this purpose water from the water supply system of the aircraft is supplied to the evaporators 14, 16, 18 via the supply collecting line 50 and the supply lines 52, 54, 56 as the fluid F which is to be converted to the gaseous state of aggregation in the evaporators 14, 16, 18.

The first and second adsorbers 24, 26 are connected via the fluid removal device 34 to the waste water system of the aircraft, for example a water storage tank. Otherwise the structure and the mode of operation of the cooling system 10 which is shown in FIG. 3 correspond to the structure and the mode of operation of the system according to FIG. 2.

FIG. 4 shows a special application of a cooling system 10 in which the evaporator 14 for receiving the fluid F which is to be evaporated is formed by a water storage tank, which is part of a drinking water dispenser system for supplying the passengers on board an aircraft with cooled drinking water. The evaporator 14 in the form of a water storage tank is connected via a drinking water supply line 64 to the drinking water dispenser system, which is not illustrated in detail. A valve 65 is disposed in the drinking water supply line 64 to control the supply of drinking water into the evaporator 14 in the form of a water storage tank. The evaporator 14 in the form of a water storage tank also comprises a drinking water tap 66 for withdrawing cooled drinking water. The withdrawal of drinking water via the drinking water tap 66 is controlled by means of a valve 67.

The evaporator 14 is in addition connected to a pressure regulating system 68 which serves to regulate the pressure in the evaporator 14 in the form of a drinking water tank. The pressure regulating system 68 is connected via a valve 70 to the evaporator 14 and is in addition able to generate both an underpressure and an overpressure in the evaporator 14.

The first and second adsorbers 24, 26 of the cooling system 10 are connected via the fluid removal device 34 to the waste water system of the aircraft, as in the case of the system which is shown in FIG. 3.

The mode of operation of the cooling system 10 which is shown in FIG. 4 is illustrated in the following. When the drinking water which is received in the evaporator 14 in the form of a drinking water storage tank has reached the desired cool dispensing temperature, the evaporator 14 is maintained at an overpressure by means of the pressure regulating system 68, so that the delivery pressure which is required for withdrawing drinking water from the evaporator 14 is available at the drinking water tap 66.

If, on the other hand, the temperature of the drinking water in the evaporator 14 exceeds the desired tapping temperature, an underpressure is generated in the evaporator 14 by means of the pressure regulating system 68, so that drinking water which is received in the evaporator 14 can be converted to the gaseous state of aggregation. The refrigerating energy which is released in the process can be used to cool the remaining drinking water in the evaporator 14. Otherwise the structure and the mode of operation of the cooling system 10 according to FIG. 4 correspond to the structure and the mode of operation of the cooling system which is shown in FIG. 3.

The invention claimed is:

1. Water dispenser system for supplying passengers on board an aircraft with cooled drinking water, the water dispenser system comprising:
    an evaporator (14) in the form of a drinking water storage tank for receiving drinking water which is to be evaporated, wherein the evaporator (14) is connected to a drinking water supply line (64) for supplying drinking water to the evaporator (14) and to a drinking water tap (66) for withdrawing cooled drinking water from the evaporator (14),
    a first adsorber (24) which contains a medium (28) for the adsorption of the drinking water which is evaporated in the evaporator (14),
    a second adsorber (26) which contains a medium (28) for the adsorption of the drinking water which is evaporated in the evaporator (14), and
    a control system (22) which is adapted to establish or to interrupt a fluid connection between the evaporator (14) and the first and/or the second adsorber(s) (24, 26).

2. Water dispenser system according to claim 1, characterised in that the first and/or the second adsorber(s) (24, 26) are/is integrated into a refrigeration cycle or an energy supply system which provides the energy which is required for the regeneration of the first and/or second adsorber(s) (24, 26).

3. Water dispenser system according to claim 1, characterised in that the first and/or the second adsorber(s) (24, 26) are/is connected to a fluid removal device (34) which is adapted to remove fluid (F) released during the regeneration of the first and/or the second adsorber(s) (24, 26) from the first and/or the second adsorber(s) (24, 26).

4. Water dispenser system according to claim 3, characterised in that the fluid removal device (34) is connected to a cooler (46) which in turn is in fluid connection with a fluid inlet of the evaporator (14).

5. Water dispenser system according to claim 3, characterised in that the fluid removal device (34) is connected to a waste water system of the aircraft.

6. Water dispenser system according to claim 4, characterised in that the fluid removal device (34) is connected to a waste water system of the aircraft.

7. Water dispenser system according to claim 1, characterised in that the drinking water storage tank is connected to a pressure regulating system (68) for regulating the pressure in the drinking water storage tank.

8. Method for dispensing cooled drinking water to passengers on board an aircraft, the method comprising:
    supplying drinking water to an evaporator (14) in the form of a drinking water storage tank via a drinking water supply line (64),
    evaporating a part of the drinking water received in the evaporator (14),
    establishing a fluid connection between the evaporator (14) and a first adsorber (24), so that the drinking water which is evaporated in the evaporator (14) is adsorbed at a medium (28) which is contained in the first adsorber (24),
    interrupting the fluid connection between the evaporator (14) and the first adsorber (24),
    establishing a fluid connection between the evaporator (14) and a second adsorber (26), so that the drinking water which is evaporated in the evaporator (14) is adsorbed at a medium (28) which is contained in the second adsorber (26),
    supplying regeneration energy to the first adsorber (24) while the evaporator (14) is connected to the second adsorber (26), and withdrawing drinking water, which is cooled by refrigerating energy released by evaporating the part of the drinking water, from the evaporator (14) via a drinking water tap (66).

9. Method according to claim 8, characterised in that a continuous cooling process is implemented through the alternating use of the first and second adsorber(s) (24, 26).

10. Method according to claim 8, characterised in that the energy which is required to regenerate the first and/or the second adsorber(s) (24, 26) is provided by a refrigeration cycle or an energy source present in the aircraft, into which the first and/or the second adsorber(s) (24, 26) are/is integrated.

11. Method according to claim 8, characterised in that fluid (F) which is released during the regeneration of the first and/or the second adsorber(s) (24, 26) is removed from the first and/or the second adsorber(s) (24, 26) via a fluid removal device (34) which is connected to the first and/or the second adsorber(s) (24, 26).

12. Method according to claim 11, characterised in that the fluid (F) which is released during the regeneration of the first and/or the second adsorber(s) (24, 26) is supplied via the fluid removal device (34) to a cooler (46) which in turn is in fluid connection with a fluid inlet of the evaporator (14).

13. Method according to claim 11, characterised in that the fluid (F) which is released during the regeneration of the first and/or the second adsorber(s) (24, 26) is supplied via the fluid removal device (34) to a waste water system of the aircraft.

14. Method according to claim 12, characterised in that the fluid (F) which is released during the regeneration of the first and/or the second adsorber(s) (24, 26) is supplied via the fluid removal device (34) to a waste water system of the aircraft.

15. Method according to claim 8, characterised in that the pressure in the drinking water storage tank is regulated by means of a pressure regulating system (68) which is connected to the drinking water storage tank.

16. Method according to claim 8, characterised in that the regeneration of the adsorbers (24, 26) does not impair the cooling of the drinking water.

\* \* \* \* \*